(12) United States Patent
Ellsberry et al.

(10) Patent No.: US 7,180,165 B2
(45) Date of Patent: Feb. 20, 2007

(54) STACKABLE ELECTRONIC ASSEMBLY

(75) Inventors: Mark Ellsberry, Santa Clara, CA (US); Charles E. Schmitz, Granada Hills, CA (US); Chi She Chen, Walnut, CA (US); Victor Allison, Huntington, TX (US)

(73) Assignee: Sanmina, SCI Corporation, San Jose, CA (US)

( * ) Notice: Subject to any disclaimer, the term of this patent is extended or adjusted under 35 U.S.C. 154(b) by 0 days.

(21) Appl. No.: 10/656,452

(22) Filed: Sep. 5, 2003

(65) Prior Publication Data

US 2005/0051903 A1    Mar. 10, 2005

(51) Int. Cl.
*H01L 23/02* (2006.01)
(52) U.S. Cl. .................. 257/686; 257/777; 257/685; 257/778; 438/108; 438/109; 361/760
(58) Field of Classification Search ............. 257/777, 257/E25.006, E25.013, E21.511, E23.069, 257/686, 778, 786, 780, 781, 712, 713, 747, 257/692, 693, 698, 723, 737, 738, 783, 803
See application file for complete search history.

(56) References Cited

U.S. PATENT DOCUMENTS

| | | | | |
|---|---|---|---|---|
| 3,746,934 A |  | 7/1973 | Stein | 361/810 |
| 4,698,267 A | * | 10/1987 | Tokarsky | 428/474.4 |
| 4,773,868 A |  | 9/1988 | Heinecke | 439/69 |
| 5,130,894 A |  | 7/1992 | Miller | 361/735 |
| 5,172,303 A |  | 12/1992 | Bernardoni et al. | 361/744 |
| 5,222,014 A |  | 6/1993 | Lin | 361/792 |
| 5,334,875 A |  | 8/1994 | Sugano et al. | 257/686 |
| 5,394,303 A |  | 2/1995 | Yamaji | 361/749 |
| 5,434,745 A |  | 7/1995 | Shokrgozar et al. | 361/735 |
| 5,455,385 A |  | 10/1995 | Newton et al. | 174/52.4 |
| 5,502,667 A |  | 3/1996 | Bertin et al. | 365/51 |
| 5,544,017 A |  | 8/1996 | Beilin et al. | 361/790 |
| 5,574,630 A | * | 11/1996 | Kresge et al. | 361/792 |
| 5,586,010 A |  | 12/1996 | Murtuza et al. | 361/751 |
| 5,666,272 A |  | 9/1997 | Moore et al. | 361/735 |
| 5,699,234 A |  | 12/1997 | Saia et al. | 361/790 |
| 5,701,233 A |  | 12/1997 | Carson et al. | 361/735 |
| 5,702,984 A |  | 12/1997 | Bertin et al. | 438/15 |
| 5,712,768 A |  | 1/1998 | Werther | 361/767 |
| 5,715,144 A |  | 2/1998 | Ameen et al. | 361/790 |
| 5,721,671 A |  | 2/1998 | Ruque | 361/796 |
| 5,748,452 A |  | 5/1998 | Londa | 361/790 |
| 5,781,415 A |  | 7/1998 | Itoh | 361/790 |
| 5,783,870 A |  | 7/1998 | Mostafazadeh et al. | 257/791 |
| 5,798,567 A | * | 8/1998 | Kelly et al. | 257/723 |
| 5,854,507 A | * | 12/1998 | Miremadi et al. | 257/686 |
| 5,857,858 A |  | 1/1999 | Gorowitz et al. | 439/86 |
| 5,883,426 A | * | 3/1999 | Tokuno et al. | 257/686 |

(Continued)

*Primary Examiner*—Kenneth Parker
*Assistant Examiner*—Chris C. Chu
(74) *Attorney, Agent, or Firm*—Loza & Loza LLP (57) ABSTRACT

On implementation of the invention provides a stackable chip-scale package for improving memory density that may be mounted within a limited area or module. A novel staggered routing scheme enables the use of the same trace routing at every level of the stacked architecture for efficiently accessing individual memory devices in a chip-scale package stack. The use of a ball grid array chip-scale package architecture in combination with thermally compatible materials decreases the risk of thermal cracking while improving heat dissipation. Moreover, this architecture permits mounting support components, such as capacitors and resistors, on the chip-scale package.

21 Claims, 4 Drawing Sheets

U.S. PATENT DOCUMENTS

| | | | |
|---|---|---|---|
| 5,898,575 A | 4/1999 | Hawthorne et al. | 361/809 |
| 5,907,903 A | 6/1999 | Ameen et al. | 29/830 |
| 5,953,210 A * | 9/1999 | Lo | 361/704 |
| 5,963,430 A | 10/1999 | Londa | 361/790 |
| 5,973,392 A * | 10/1999 | Senba et al. | 257/686 |
| 5,977,640 A * | 11/1999 | Bertin et al. | 257/777 |
| 5,995,379 A * | 11/1999 | Kyougoku et al. | 361/803 |
| 6,014,316 A | 1/2000 | Eide | 361/735 |
| 6,025,648 A * | 2/2000 | Takahashi et al. | 257/778 |
| 6,049,467 A | 4/2000 | Tamarkin et al. | 361/790 |
| 6,093,029 A | 7/2000 | Kwon et al. | 439/69 |
| 6,125,039 A | 9/2000 | Suzuki | 361/720 |
| 6,133,626 A | 10/2000 | Hawke et al. | 257/686 |
| 6,137,164 A * | 10/2000 | Yew et al. | 257/686 |
| 6,163,462 A | 12/2000 | Buck | 361/767 |
| 6,180,881 B1 * | 1/2001 | Isaak | 174/52.4 |
| 6,188,127 B1 * | 2/2001 | Senba et al. | 257/686 |
| 6,195,268 B1 | 2/2001 | Eide | 361/803 |
| 6,222,265 B1 | 4/2001 | Akram et al. | 257/723 |
| 6,239,496 B1 * | 5/2001 | Asada | 257/777 |
| 6,265,772 B1 | 7/2001 | Yoshida | 257/712 |
| 6,274,929 B1 * | 8/2001 | Leong et al. | 257/724 |
| 6,297,960 B1 * | 10/2001 | Moden et al. | 361/719 |
| 6,303,997 B1 * | 10/2001 | Lee | 257/778 |
| 6,331,939 B1 | 12/2001 | Corisis et al. | 361/784 |
| 6,339,254 B1 * | 1/2002 | Venkateshwaran et al. | 257/686 |
| 6,381,141 B2 | 4/2002 | Corisis et al. | 361/735 |
| 6,388,333 B1 * | 5/2002 | Taniguchi et al. | 257/777 |
| 6,414,391 B1 * | 7/2002 | Corisis et al. | 257/738 |
| 6,437,990 B1 * | 8/2002 | Degani et al. | 361/783 |
| 6,448,506 B1 * | 9/2002 | Glenn et al. | 174/260 |
| 6,451,624 B1 * | 9/2002 | Farnworth et al. | 438/106 |
| 6,462,421 B1 * | 10/2002 | Hsu et al. | 257/777 |
| 6,477,058 B1 | 11/2002 | Luebs et al. | 361/784 |
| 6,504,241 B1 * | 1/2003 | Yanagida | 257/686 |
| 6,507,107 B2 * | 1/2003 | Vaiyapuri | 257/723 |
| 6,521,984 B2 * | 2/2003 | Matsuura | 257/678 |
| 6,522,022 B2 * | 2/2003 | Murayama | 257/786 |
| 6,525,943 B2 * | 2/2003 | Moden et al. | 361/719 |
| 6,525,945 B1 | 2/2003 | Louis et al. | 361/763 |
| 6,529,385 B1 | 3/2003 | Brady et al. | 361/766 |
| 6,531,337 B1 * | 3/2003 | Akram et al. | 438/108 |
| 6,538,332 B2 * | 3/2003 | Murayama et al. | 257/777 |
| 6,542,393 B1 | 4/2003 | Chu et al. | 365/51 |
| 6,545,868 B1 | 4/2003 | Kledzik et al. | 361/704 |
| 6,549,421 B2 | 4/2003 | Corisis et al. | 361/784 |
| 6,583,503 B2 | 6/2003 | Akram et al. | 257/686 |
| 6,597,062 B1 * | 7/2003 | Li et al. | 257/686 |
| 6,617,695 B1 * | 9/2003 | Kasatani | 257/778 |
| 6,703,697 B2 * | 3/2004 | Leahy et al. | 257/678 |
| 6,714,418 B2 * | 3/2004 | Frankowsky et al. | 361/735 |
| 6,717,812 B1 * | 4/2004 | Pinjala et al. | 361/699 |
| 6,740,981 B2 * | 5/2004 | Hosomi | 257/778 |
| 6,781,241 B2 * | 8/2004 | Nishimura et al. | 257/777 |
| 6,809,421 B1 * | 10/2004 | Hayasaka et al. | 257/777 |
| 2001/0008482 A1 | 7/2001 | Corisis et al. | 361/735 |
| 2001/0028114 A1 | 10/2001 | Hosomi | 257/778 |
| 2001/0036063 A1 | 11/2001 | Nagaya et al. | 361/729 |
| 2002/0075662 A1 | 6/2002 | Oh-Yang | 361/790 |
| 2002/0176233 A1 | 11/2002 | Evans | 361/735 |
| 2003/0022464 A1 * | 1/2003 | Hirano et al. | 438/460 |

* cited by examiner

STACKABLE ELECTRONIC ASSEMBLY

FIELD

Various embodiments of the invention pertain to stackable electronic assemblies. At least one embodiment of the invention pertains to a memory module using these stackable assemblies that enables higher memory densities.

DESCRIPTION OF RELATED ART

Semiconductor dice, such as memory dice, are often packaged for protection and ease of use. One type of package is a ball grid array package (BGA) in which a semiconductor die is mounted on a substrate. The semiconductor die has a plurality of bond pads that are electrically connected, via wires bonded between the metal traces on the substrate and on the die. The traces on the substrate terminate at contact pads where conductive elements, such as solder balls, are attached. The BGA package can then be mounted on a circuit board and electrically connected via the conductive elements. The BGA package may be electrically connected to metal traces on the circuit board in various ways, including applying heat or ultrasound to the conductive elements (e.g., solder balls).

One consideration when packaging semiconductor dice is thermal cracking. Thermal cracking may occur when the differences between the thermal coefficients of expansion for two materials causes solder points between them to crack. For instance, if a semiconductor die was directly soldered onto a substrate having a substantially different coefficient of expansion, temperature cycling may eventually cause soldered points, such as solder balls, to crack thus causing an electrical discontinuities. To solve this problem when packaging semiconductor dice, the area between the semiconductor die and the substrate is often underfilled, with epoxies and/or other materials, to assist in preventing thermal cracking.

Additionally, semiconductor dice are typically quite fragile, sensitive to physical impact, and environmental conditions. Thus, a die or silicon chip is typically encapsulated in an epoxy or plastic to absorb and dissipate impact forces and to protect it from environmental conditions.

However, both underfilling and/or encapsulating a device or die increases the heat retained by the device. Maintaining a low operating temperature typically increases the reliability, performance, and life of an electronic device. Thus, the increase in temperature resulting from underfilling and/or encapsulation is an undesirable side effect of increasing the reliability by protecting an electronic device.

One type of semiconductor component is a memory component, which typically includes a memory die mounted on a substrate with or without encapsulation. Over the years, memory components have remained the same dimensional size while providing increased storage capacity. Generally, this has been accomplished by reducing the size of the individual storage elements on the memory component.

Memory components are often used in memory modules, where a number of these memory components are mounted on a single substrate. However, the number of memory components that may be placed on a substrate is limited by the size of the module. Modules must typically meet the functional and physical specifications established by industry standards or other limitations imposed by a particular application. Thus, the storage capacity of a memory module is often limited by physical size restrictions. In particular, the surface area available on the memory module limits the number of memory components that can be mounted thereon.

One technique to increase the storage capacity of memory modules has been to stack surface area. However, the number of memory components that may be stacked is limited by the height restrictions on the memory module as well as the complexities of accessing stacked memory devices using existing bus interfaces designed for non-stacked architectures.

Thus, the prior art is still seeking an economical solution for increasing the stacking of memory devices while addressing the packaging requirements of memory modules.

SUMMARY OF THE INVENTION

One aspect of the invention provides a stackable semiconductor device architecture with each semiconductor device soldered onto a chip-scale ball grid array package. A second aspect of the invention provides a way to reduce thermal cracking of soldered points by using controlled thermal expansion substrates that substantially match the coefficient of expansion of semiconductor devices mounted thereon. A third aspect of the invention provides a semiconductor die mounting technique that improves heat dissipation by exposing all six surfaces of the semiconductor die mounted on a chip-scale package. A fourth aspect of the invention provides a chip-scale ball grid array package that permits mounting of components, such as capacitors and resistors, thereon. A fifth aspect the invention provides a staggered routing scheme that enables the use of the same trace routing at every level of the stacked architecture.

One implementation of the invention provides a memory module with stacked chip-scale ball grid array packages that increase the memory capacity of the module, while conforming to module dimensional requirements.

DETAILED DESCRIPTION

In the following description numerous specific details are set forth in order to provide a thorough understanding of the invention. However, one skilled in the art would recognize that the invention may be practiced without these specific details. In other instances, well known methods, procedures, and/or components have not been described in detail so as not to unnecessarily obscure aspects of the invention.

In the following description, certain terminology is used to describe certain features of one or more embodiments of the invention. For instance, "die" refers to a semiconductor device, such as a silicon memory device, that is not packaged or covered in a protective plastic, epoxy, or other material. The term "underside coupling members" is used to refer to such relatively rigid electrical coupling members as conductive bumps, conductive balls (e.g., solder or gold balls), and conductive rods.

One aspect of the invention provides a stackable semiconductor device architecture with each semiconductor device soldered onto a chip-scale package (CSP) having ball grid array connections. A second aspect of the invention provides a way to reduce thermal cracking of soldered points by using controlled thermal expansion substrates that substantially match the coefficient of expansion of semiconductor die mounted thereon. A third aspect of the invention provides a die mounting technique that improves heat dissipation by exposing all six surfaces of a die mounted in a chip-scale package. A fourth aspect of the invention provides a chip-scale package that permits mounting of signal conditioning (filtering) components, such as capacitors and resistors, thereon. A fifth aspect the invention provides a staggered routing scheme that enables the use of the same trace routing for every level of the stacked architecture.

One implementation of the invention provides a memory module with stacked memory components that increases the memory capacity of the module, while conforming to module dimensional requirements.

Figure 1:
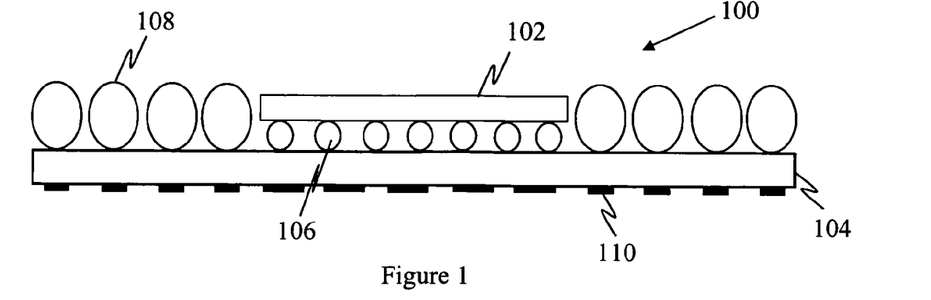
FIG. 1 illustrates a side view of a chip-scale ball grid array package with a semiconductor die mounted on a substrate according to one embodiment of the invention.

FIG. 1 illustrates a side view of a chip-scale ball grid array package 100 including a semiconductor die 102 mounted on a substrate 104 according to one embodiment of the invention. The chip-scale ball grid array package 100 includes a plurality of solder balls 108 on a first surface of the substrate 104. One or more of the solder balls 108 may be electrically coupled to the semiconductor die 102 and/or contact pads 110.

One aspect of an implementation of the invention provides that the solder balls 108 have a higher profile than the semiconductor die 102 to mechanically protect the semiconductor die 102, from direct impact, etc., without the disadvantages of encapsulation. The solder balls 108 should be sufficiently large so that they rise above the semiconductor die 102 on the first surface of the chip-scale substrate 104. Mounting the semiconductor die 102 on the same side as solder balls 108 creates a flip chip assembly, where the semiconductor package can then be coupled to other substrates via the solder balls. Additionally, the higher profile solder balls permit the package 100 to be mounted on other substrates without interference from the semiconductor die 102.

Another aspect of the invention provides a way to reduce thermal cracking in the contacts between a semiconductor die and the substrate on which it is mounted. Conventional chip mounting techniques typically utilize wire bonds to electrically couple the semiconductor die to a contact point on the substrate. However, such mounting techniques typically require that the space between the semiconductor die and the mounting surface be underfilled or injected with a securing material, such as an epoxy, to fasten the semiconductor die to the substrate. However, as previously discussed, this is undesirable because it tends to hinder heat dissipation from the semiconductor device.

As illustrated in FIG. 1, a semiconductor die 102 is mounted on a substrate 104 using such rigid underside coupling members 106 as gold or solder balls, conductive polymer contacts, and/or under bump metallization. To prevent the coupling members 106 from cracking as a result of thermal cycling, one feature of the invention provides that the substrate 104 have a coefficient of thermal expansion matched to the coefficient of thermal expansion of the semiconductor die 102. That way, both the semiconductor die 102 and substrate 104 expand and contract at similar rates, thus reducing the stress on the coupling members 106. To achieve this, one aspect of the invention employs controlled thermal expansion (CTE) substrates that substantially match the coefficient of expansion of semiconductor devices mounted thereon.

Typical mounting substrates have a coefficient of expansion of approximately sixteen (16) to eighteen (18) parts per million per degree Celsius (ppm/° C.) while silicon semiconductors have a nominal coefficient of expansion of approximately three (3) ppm/° C. Through temperature cycling, such disparity in coefficients of expansion often leads to cracks in electrical interconnects between such mounting substrates and silicon semiconductor devices. Employing a Coffin-Manson-type analysis, for instance, an adequate range of "matching" coefficients of expansion may be determined. An acceptable match will vary depending on the ranges of temperatures over which the materials will be cycled, the number of temperature cycles expected in the life of a device, the dimensions of the substrate, the material employed to couple a first substrate to a second substrate, etc. The closer the two materials (e.g., silicon semiconductor and mounting substrate) are to an exact match, the better the situation. Application-specific thermal-mechanical reliability may be readily tailored to meet the requirements of the specific operating environment (e.g., solder and/or gold ball interconnections and/or conductive polymer materials).

In one implementation of the invention, a chip-scale ball grid array package includes a controlled CTE mounting substrate, having a coefficient of expansion of between six (6) and nine (9) ppm/° C., and a silicon semiconductor device having a nominal coefficient of expansion of approximately three (3) ppm/° C. The coefficient of expansion of the mounting substrate may be adjusted by varying its composition.

According to a Coffin-Manson-type analysis of a CTE material known as Thermount 85 NT, a coefficient of expansion of approximately eight (8) ppm/° C. is acceptable for memory modules using silicon semiconductor devices having a coefficient of expansion of approximately three (3) ppm/° C. Such match is acceptable for dual in-line memory module (DIMM) applications, for instance.

Generally, the invention employs substrate materials made from a tailored CTE to assure the reliability for a given device in an operating environment. Some of the types of materials that may be used include:

Arlon (Thermount) 85NT, with a coefficient of thermal expansion ranging from 6.0 to 9.0 ppm/° C., depending on the resin contents;

Arlon (Thermount) 55 NT, with a coefficient of thermal expansion ranging from 7.0 to 10.0 ppm/° C., depending on the resin contents;

CMC (copper-molybdenum-copper cores), with a baseline coefficient of thermal expansion greater than or equal to 5.5 ppm/° C., where varying the CTE by varying the copper thickness varies this coefficient (e.g., (copper-molybdenum-copper) 5/90/5=5.58 ppm/° C., 13/74/13=5.8 ppm/° C.);

CIC (copper-Invar-copper) cores, with a baseline coefficient of thermal expansion greater than or equal to 5.1 ppm/° C., where varying the CTE by varying the copper thickness varies this coefficient (e.g., (copper-Invar-copper) 20/60/20=5.2 ppm/° C.);

Ceramic cores having a coefficient of thermal expansion in the range of 4.5–6.5 ppm/° C. (e.g., AlN at 4.5 and Alumina at 6.5).

Another aspect of the invention provides improved heat dissipation from the semiconductor die 102 by leaving all six surfaces of the die exposed. Unlike the prior art that is typically underfilled or completely encapsulated, the present invention exposes all six sides of a semiconductor die, including a substantial portion of the underside of the semiconductor die. That is, by mounting the semiconductor die 102 using solder balls, under bump metallization, and/or other similar electrically coupling members 106, a gap is created between the chip-scale substrate 104 and the underside of the semiconductor die 102. Because all of the surfaces of the die 102, including the underside surface, are now exposed to airflow, the semiconductor die 102 has improved heat dissipation. Note that the fact that the solder balls 108 have a higher profile than the mounted semiconductor die 102 means that the upper surface of the semiconductor die 102 is also exposed to airflow.

Figure 2:
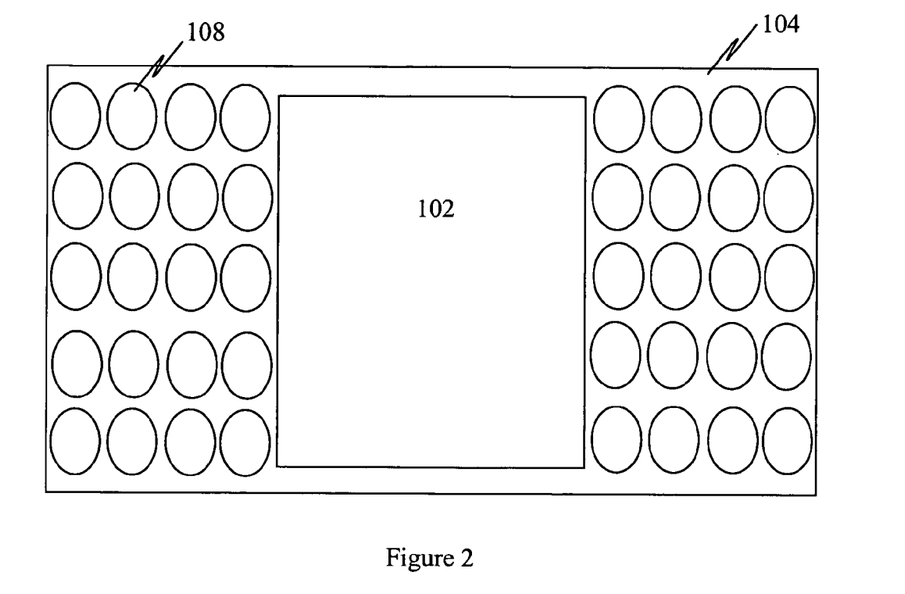
FIG. 2 illustrates a surface view of a chip-scale ball grid array package with a semiconductor die mounted on a substrate according to one embodiment of the invention.

FIG. 2 illustrates a surface view of a chip-scale ball grid array package utilizing a semiconductor die mounted on a substrate according to one embodiment of the invention. The chip-scale ball grid array package may include a plurality of solder balls 108 along a surface of the substrate 104. In one implementation, the plurality of solder balls 108 may be arranged in rows and columns, as shown in FIG. 2, while in other implementations the plurality of solder balls 108 may be arranged in other configurations.

Figure 3:
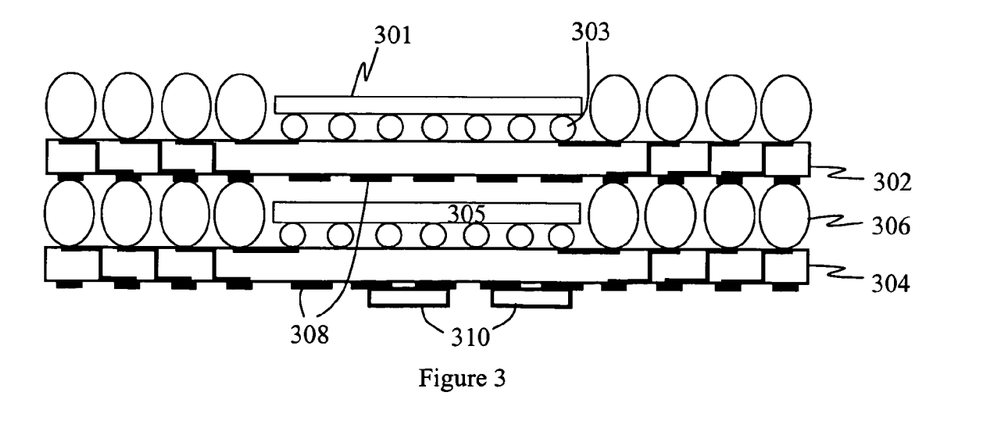
FIG. 3 illustrates a side-view of a stacked pair of chip-scale ball grid array packages using memory dice according to one embodiment of the invention.

FIG. 3 illustrates a stacked chip-scale ball grid array package using memory dice according to one embodiment of the invention. A plurality of the chip-scale ball grid array packages 302 and 304 may be vertically stacked with a first surface of a first package 302 being coupled to an opposing second surface of a second package 304 and so on for each successive layer in the stack. In particular, the contact pads (e.g., 110 in FIG. 1) on the second surface of the second package 304 are electrically coupled to corresponding pads on the first surface of the first package 302. Because the solder balls 308 have a larger vertical profile or height than the semiconductor die 305, this permits stacking the first package 302 over the second package 304. In this manner, a plurality of packages may be stacked to increase the density of semiconductor devices that may be mounted on a given area. For example, when the semiconductor die 301 and 305 are memory die, stacking a plurality of memory devices increases the capacity of a memory module in comparison to single-layer chip architectures.

One aspect of the invention provides a chip-scale ball grid array package that permits mounting of components, such as capacitors and resistors, thereon. By mounting the semiconductor die 305 on the substrate 304 using connects 303, surface space is freed on the substrate above semiconductor die 305. In one implementation, the surface space above the semiconductor die always includes pads 306 on which signal conditioning components may be mounted. This surface area may have one or more pads 306 for connecting signal filtering components thereon. This permits mounting on-chip electrical components 310, such as capacitors and resistors, which may be used for signal conditioning to and!or from the semiconductor die 305. Being able to mount components 310 on the package substrate itself (e.g., chip-scale substrate) is an advantage over the prior art that was limited to mounting said components only external to the package. In one implementation of the invention, such components 310 are signal conditioning capacitors and pull-up/pull-down resistors.

According to other implementations, other ball grid array configurations may be employed without deviating from the invention.

Figure 4:
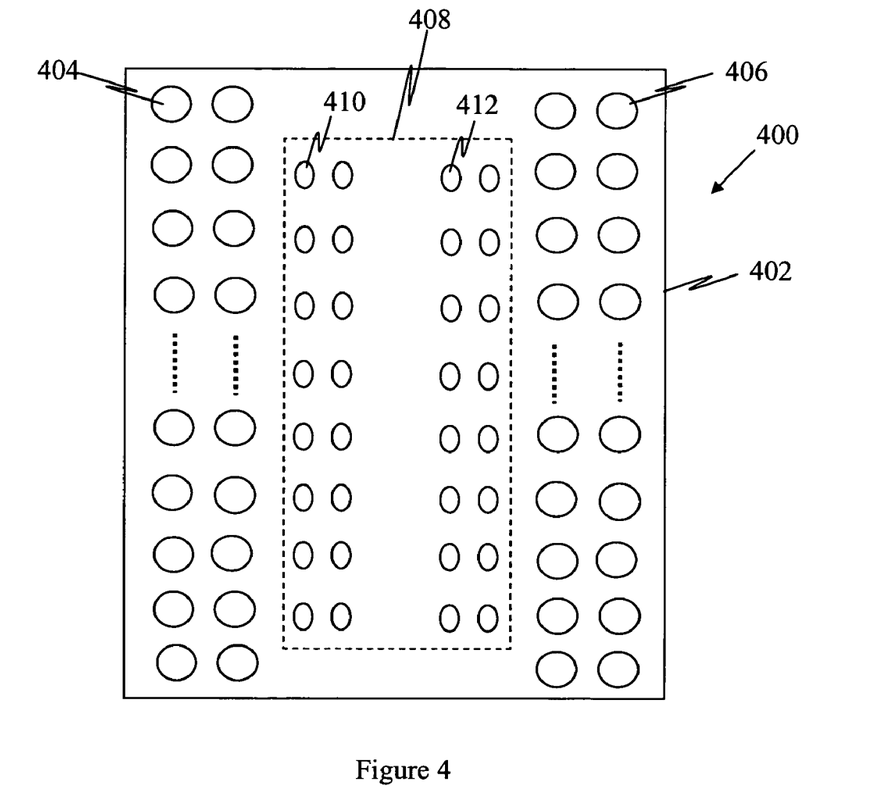
FIG. 4 illustrates a surface view of a chip-scale ball grid array package with a semiconductor die mounted on a substrate according to a second embodiment of the invention.

FIG. 4 illustrates a surface view of a chip-scale ball grid array package with a semiconductor die mounted on a substrate according to a second embodiment of the invention. This configuration includes a substrate 402 with a plurality of solder ball connects 404 and 406 arranged as two columns on either side of a semiconductor die 408 mounted on the substrate 402. The semiconductor die 408 may be mounted on the substrate 402 by rigid underside coupling members 410 and 412, also arranged in two columns along the length of the semiconductor die 408. The underside coupling members 410 and 412 are electrically coupled to a plurality of the solder balls 404 and 406. The solder balls 404 and 406 are electrically coupled to pads on the opposite surface of the substrate 402.

In one implementation of the invention, the outboard columns of balls/electrical interconnections (e.g., 404 and 406) is two wide per side times whatever length is required to effectively address the maximum number of chip-scale packages to be stacked. For example, the basic I/O count required for a typical two hundred and fifty-six (256) Megabyte (Mb) synchronous dynamic (SD) random access memory (RAM) silicon device is forty-eight (48), two of which are for unique "addressing". Hence, in a one high implementation, only forty-eight (48) I/O ball/electrical interconnections 404 and 406 would be required. Since each additional device requires unique clock enable and chip select addressing interconnects, a two high stack would require that all chip-scale packages in that stack have fifty (50) interconnects 404 and 406. A four-high stack would require fifty-four (54) ball/electrical interconnections 404 and 406 and so forth.

Figure 5:
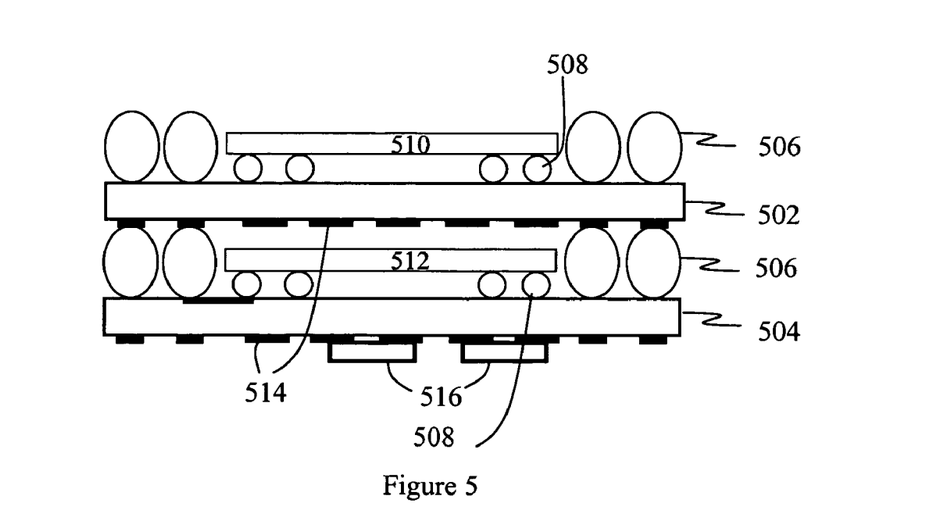
FIG. 5 illustrates a side-view of a stacked pair of chip-scale ball grid array packages using memory dice according to a second embodiment of the invention.

FIG. 5 illustrates a side-view of stacked chip-scale ball grid array packages using memory dice according to a second embodiment of the invention. A plurality of chip-scale packages 502 and 504, like that illustrated in FIG. 4, are stacked as shown and in a similar manner to the stacked package described in FIG. 3. Each substrate 502 and 504 includes two columns of solder balls 506 along the sides of semiconductor devices 510 and 512 mounted thereon. A plurality of underside electrical interconnects 508 couples the semiconductor devices 510 and 512 to their respective substrates 502 and 504. Each substrate also includes a plurality of pads 514 on the surface opposite the semiconductor device that may be used to couple signal filtering components 516.

Figure 6:
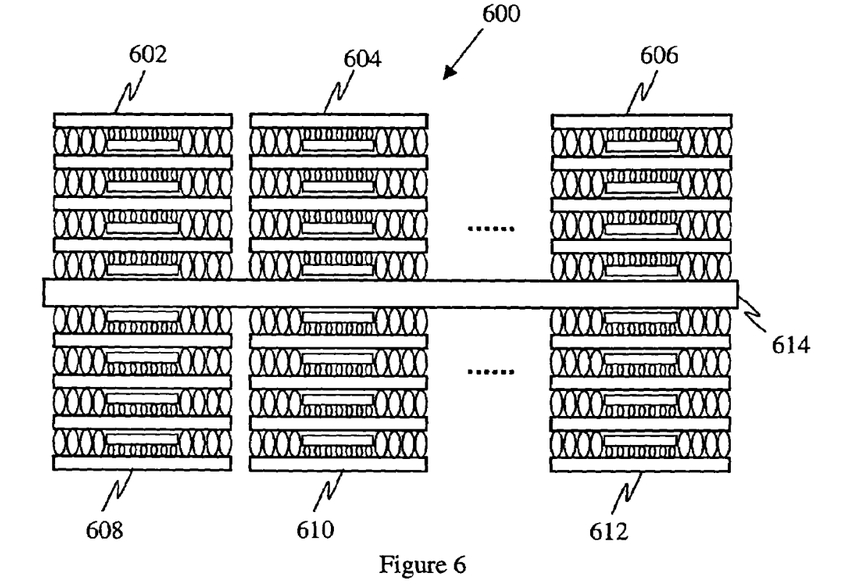
FIG. 6 illustrates a memory module with stacked memory components on both surfaces of the memory module according to one embodiment of the invention.

FIG. 6 illustrates a memory module 600 with a plurality of stacked memory components 602, 604, 606, 608, 610, and 612 on both surfaces of the memory module 614 according to one embodiment of the invention. A plurality of stacked chip-scale ball grid array packages 602, 604, 606, 608, 610, and 612 may be mounted on one or more surfaces of a substrate 614.

In one implementation of the invention, the semiconductor devices (e.g., 102) may be random access memory devices mounted on stacked chip-scale packages (e.g., 602, 604, 606, 608, 610, and 612). The stacked packages (e.g., 602, 604, 606, 608, 610, and 612) are then mounted on either or both sides of a substrate to form a memory module 600, such as a single inline memory module (SIMM) or dual inline memory module (DTMM). The dimensional requirements of the memory module 600 may limit the number of packages (e.g., 100) that may be stacked.

In yet other implementations, the stacked packages may be mounted directly on a computer motherboard or other type of module.

Figure 7:
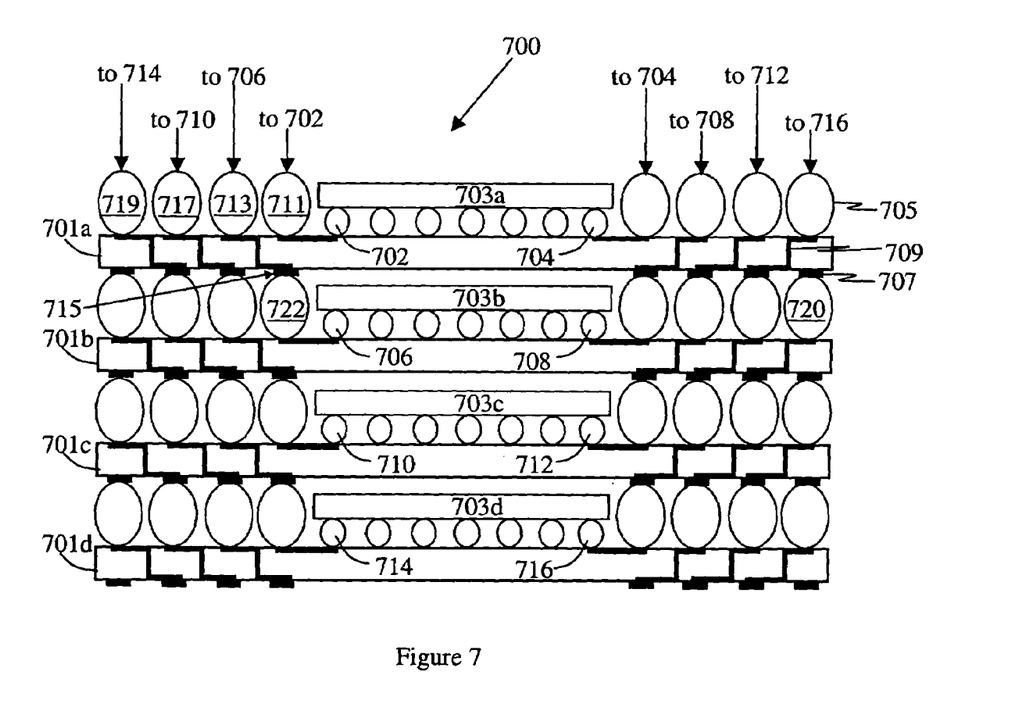
FIG. 7 illustrates a routing scheme for stackable packages according to one embodiment of the invention.

FIG. 7 illustrates a routing scheme for a package stack 700 according to one embodiment of the invention. One difficulty in implementing the stackable package architecture is providing a simple way to access each semiconductor device (e.g., memory device) independently. Prior art stackable architectures have typically required customizing the chip-scale package substrate at each level of a stack to enable access to each chip independently. That is, for the same pin on each a chip in a package stack, a different electrical contact must be used at the interface with the module substrate to access each chip independently. This typically necessitates customizing chip-scale package substrates at each level of the stacked packages, with jumpers or trace punching for instance, to provide the appropriate routing from the interface with the module board to the chip. However, manufacturing and assembling such stacked semiconductor chip-scale packages is costly and cumbersome since customized chip-scale package substrates are typically necessary for each level of the stacked package.

According to one embodiment of the invention, identical chip-scale package substrates 701*a–d* are employed at each level of the stacked package 700 with the semiconductor dice 703*a–d* mounted in the same manner on each chip-scale substrate 701*a–d*. Using identical substrates 701*a–d* for every level of the stacked package 700 and mounting the dice 703*a–d* in an identical manner avoids the costs and difficulties of having to customize each level. Thus, a plurality of chip-scale ball grid array packages 701*a–d* may be manufactured and later assembled into a stack without regard as to any particular order.

The use of identical chip-scale packages at every level of a stack package 700 is made possible by a novel routing scheme that permits accessing each semiconductor die 703*a–d* independently and without customization of the substrates 701*a–d*. The novel routing scheme provides cascading connections through all levels of the stack package 700 to electrically couple each semiconductor die 703*a–d* to a primary access point (e.g., the solder balls on substrate 701*a*).

According to implementation of the novel routing scheme, each substrate 701*a–d* includes a plurality of solder balls 705 mounted on a first surface of the substrate 701*a–d* and a plurality of corresponding pads 707 on a second opposite surface of the substrate 701*a–d*. Interconnects 709 serve to electrically couple the solder balls 705 to the pads 707. A cascading scheme, as illustrated in FIG. 7, permits independently accessing each semiconductor die from a primary access point (e.g., the solder balls on substrate 701*a*). The cascading scheme electrically couples the solder balls closest to the semiconductor die to a contact on the semiconductor die. For example, solder ball 711 is electrically coupled to a contact 702 on semiconductor die 703*a*. This implementation of the routing scheme provides for solder balls, on a first surface of a chip-scale package substrate, to be electrically coupled to pads, on a second surface of the chip-scale package substrate, that are closer to the semiconductor die. For example, solder ball 713 is electrically coupled to pad 715. Similarly, solder balls 717 and 719 are coupled to pads that are closer to the semiconductor die 703*a*. This routing scheme is implemented at every chip-scale package substrate 701*a–d* in the stack package 700. When the chip-scale package substrates are stacked on top of each other as shown, the each pad (e.g., 707) on the second surface of a first substrate (e.g., 701*a*) is electrically coupled to a corresponding solder ball (e.g., 720) on a first surface of a second substrate (e.g., 701*b*). Thus, a cascading routing scheme results that electrically couples solder balls (e.g., 713) in one substrate (e.g., 701*a*) to solder balls (e.g., 722) in a second substrate (e.g., 701*b*) that are closer to the interface point of a semiconductor die. Consequently, solder ball 713 is electrically coupled to connect 706, solder ball 717 is electrically coupled to connect 710, and solder ball 719 is electrically coupled to connect 714. A similar scheme may be implemented on the other side of the semiconductor die such that die connects 704, 708, 712, and 716 are electrically coupled to solder balls on substrate 701*a*. The stacked package of semiconductor devices may then be coupled to another substrate or interface via the solder balls on the first surface of substrate 701*a*.

Note that the solder balls may be cascaded in different ways and utilizing different solder ball layouts without deviating from the invention. For example, a cascading routing scheme may be implemented using chip-scale packages similar to that illustrated in FIGS. 4 and 5. The cascading scheme may be implemented in two solder ball columns (e.g., 404) by zigzagging back and forth between solder balls across multiple package layers to effectively implement the routing scheme illustrated in FIG. 7. That is, the electrical pad on a first surface of a substrate is electrically coupled to a solder ball on a second surface of the substrate and substantially diagonal relative to the alignment of other pads and solder balls. In other implementations, the routing scheme shown in FIG. 7 may also be implemented by interconnecting solder balls along a single column (e.g., one of the outer columns in semiconductor package 400) across multiple chip-scale package layers. In short, the staggered routing scheme illustrated in FIGS. 7 and 8 may be implemented in various ways, including single column, single row, and/or diagonal/zigzag interconnections across various layers of a stack.

In yet other implementations, only part of the solder balls are interconnected using a cascading scheme while part of the remaining solder balls are connected in a non-cascading manner across the stacked package. That is, some of the solder balls in the same position across all layers of a stack may be commonly connected.

Figure 8:
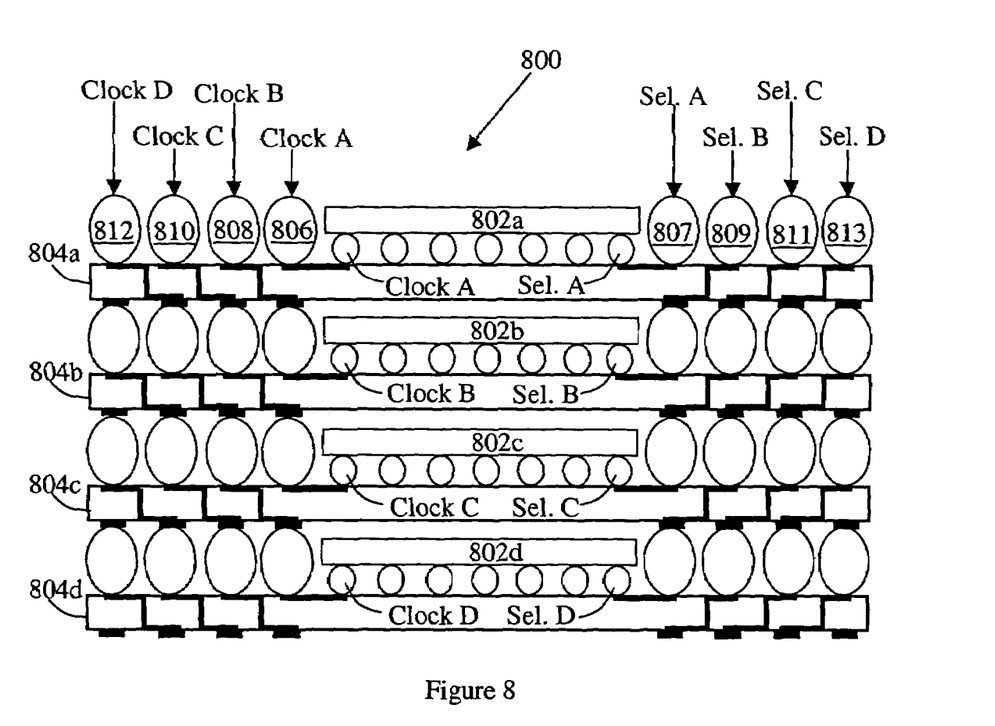
FIG. 8 illustrates stacked memory components according to one implementation of the invention.

FIG. 8 illustrates a stacked memory package 800 according to one implementation of the invention. Memory dice 802*a–d* are mounted on chip-scale package substrates 804*a–d*. In one implementation, the memory components 802*a–d* share common data lines or a bus that serves to write and/or read data (e.g., bits) to and from the memory devices 802*a–d*. In order to correctly write to and/or read from a particular memory device, the cascading scheme described in FIG. 7 is implemented for individual chip selection and clock enabling. The individual packaged memory dice 802*a–d* may be enabled and/or disabled providing an appropriate signal at solder balls 806–813. For example, memory device 802*a* may be accessed by enabling Clock A at solder ball 806 and chip Select A at solder ball 807. Similarly, memory device 802*b* may be accessed by enabling Clock B at solder ball 808 and chip Select B at solder ball 809, memory device 802*c* may be accessed by enabling Clock C at solder ball 810 and chip Select C at solder ball 811, and memory device 802*d* may be accessed by enabling Clock D at solder ball 812 and chip Select D at solder ball 813.

Oftentimes, the size of a stacked memory or semiconductor package is limited by the space available on which to mount it in a particular implementation. Thus, one implementation of the invention employs tightly spaced components to maximize semiconductor or memory density of a stack package. For instance, in one implementation of the invention, the substrate (e.g., 104 in FIG. 2 or 402 in FIG. 4) is approximately twelve (12) millimeters (mm) long by ten (10) mm wide by 0.20 mm thick. Additionally, the solder balls (e.g., 308 in FIG. 3, or 506 in FIG. 5) may be approximately 0.50 mm in diameter, while the height or thickness of a particular chip-scale package (e.g., 100 in FIG. 1) is approximately 0.50 mm. Similarly, the thickness or height of two stacked chip-scale packages (e.g., as those illustrated in FIGS. 3 and 5) is approximately 1.00 mm and so forth.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications are possible. Those skilled, in the art will appreciate that various adaptations and modifications of the just described preferred embodiment can be configured without departing from the scope and spirit of the invention. For example, while a semiconductor die has been used to illustrate the invention, any other electronic device or component may be used instead, with one or more aspects of the invention, without deviating from the invention. Therefore, it is to be understood that, within the scope of the appended claims, the invention may be practiced other than as specifically described herein.

What is claimed is:

1. A chip-scale package comprising:
    a substrate having a first surface and an opposite second surface, the substrate composed of a controlled thermal expansion material;
    a memory die having a first surface and an opposite second surface, the first surface of the memory die mounted facing the first surface of the substrate, the memory die is electrically coupled to the substrate using a plurality of rigid underside coupling members, the substrate having a coefficient of expansion that matches a coefficient of expansion of the memory die to within six parts per million per degree Celsius or less, wherein the second surface of the memory die remains completely exposed;
    a plurality of solder balls mounted on the first surface of the substrate in a ball grid away configuration adjacent to the memory die, at least one of the solder balls electrically coupled to at least one of the underside coupling members;
    a plurality of pads coupled to the second surface of the substrate, each pad electrically coupled to one or more of the plurality of solder balls in a staggered routing scheme; and
    one or more electronic components mounted on the second surface of the substrate in an area opposite of the memory die, wherein the combined distance that an electronic component and the memory die protrude from the substrate is less than the distance that a solder ball and pad protrude from the substrate.

2. The chip-scale package of claim 1 further comprising:
    electrically conductive traces on the first surface to electrically couple at least one solder ball to the memory die directly.

3. The chip-scale package of claim 1 wherein the plurality of rigid underside coupling members are a second plurality of solder balls.

4. The chip-scale package of claim 1 wherein five sides of the memory die are completely exposed and the first surface of the memory device is substantially exposed for improved heat dissipation.

5. The chip-scale package of claim 1 wherein the memory die is made from a different material than the substrate.

6. A chip-scale package comprising:
    a substrate having a first surface and an opposite second surface;
    a semiconductor device mounted on the first surface of the substrate using a plurality of electrical conductors, the semiconductor device having a first surface and an opposite second surface, the first surface of the semiconductor device mounted facing the first surface of the substrate, wherein the second surface of the memory device remains completely exposed for improved ventilation;
    a plurality of solder balls mounted on the first surface of the substrate in a ball grid away configuration adjacent to the semiconductor device, at least one of the solder balls electrically coupled to the semiconductor device; and
    a plurality of pads coupled to the second surface of the substrate, each pad electrically coupled to one or more of the plurality of solder balls in a staggered routing scheme which, when a plurality of chip-scale packages are stacked together, causes a solder ball of a first chip-scale package to be uniquely electrically coupled with an electrical conductor of a semiconductor device mounted on a second chip-scale package N levels from the first chip-scale package, where N is an integer greater than two.

7. The chip-scale package of claim 6 further comprising:
    one or more electrical components mounted on the second surface of the substrate in an area substantially opposite of the semiconductor device.

8. The chip-scale package of claim 7 wherein the combined distance that one or more electrical components and the semiconductor device protrude from the substrate is less than the distance that a solder ball and pad protrude from the substrate.

9. The chip-scale package of claim 6 wherein the substrate includes a controlled thermal expansion material with a coefficient of expansion that matches the coefficient of expansion of the semiconductor device to within six parts per million per degree Celsius or less.

10. The chip-scale package of claim 6 further comprising: electrically conductive traces on the first surface to directly couple at least one solder ball to the semiconductor device.

11. The chip-scale package of claim 6 wherein the memory device is made from a different material than the substrate.

12. A stackable electronic assembly comprising:
    a plurality of chip-scale packages, the plurality of chip-scale packages arranged in a stacked configuration, each chip-scale package including
    a substrate having a first surface and an opposite second surface, the substrate composed of a controlled thermal expansion material;
    a semiconductor device coupled to traces on the first surface of the substrate using underside coupling members;
    a plurality of solder balls mounted on the first surface of the substrate in a ball grid away configuration adjacent to the semiconductor device, at least one of the solder balls electrically coupled to the semiconductor device; and a plurality of pads coupled to the second surface of the substrate, each pad electrically coupled to one or more of the plurality of solder balls in a staggered routing scheme, wherein all chip-scale packages in the stacked configuration have identical routing traces, and the substrate having a coefficient of expansion that matches a coefficient of expansion of the semiconductor device to within six parts per million per degree Celsius or less.

13. The stackable electronic assembly of claim 12, the semiconductor device having a first surface and an opposite second surface, the first surface of the semiconductor device mounted towards the first surface of the substrate, wherein the second surface of the semiconductor device remains completely exposed for improved ventilation.

14. The stackable electronic assembly of claim 13 wherein five sides of the semiconductor device are completely exposed and the first surface of the memory device is exposed for improved heat dissipation.

15. The stackable electronic assembly of claim 12 further comprising:

one or more electrical components mounted on the second surface of the substrate in an area opposite of the semiconductor device, wherein the combined distance that an electronic component and the semiconductor device protrude from the substrate is less than the distance that a solder ball and pad protrude from the substrate.

16. The stackable electronic assembly of claim 12 wherein the semiconductor device is made from a different material than the substrate.

17. A memory module comprising:

a main substrate with an interface to couple the memory module to other devices; and one or more stacks of memory devices coupled to a first surface of the main substrate, at least one stack of memory devices including a plurality of chip-scale packages, the plurality of chip-scale packages arranged in a stack, all chip-scale packages in the stack having identical routing traces at every level of the stack which facilitates a staggered routing scheme between the chip-scale packages, each chip-scale package including a substrate having a first surface and an opposite second surface, a memory semiconductor die electrically coupled to traces on the first surface of the substrate, and a plurality of solder balls mounted on the first surface of the substrate adjacent to the memory semiconductor die, at least one of the solder balls electrically coupled to the memory semiconductor die, wherein the substrate is composed of a controlled thermal expansion material, the substrate has a coefficient of expansion that matches a coefficient of expansion of the memory semiconductor die to within six parts per million per degree Celsius or less, and five sides of the memory semiconductor die are completely exposed and a sixth side of the memory semiconductor die is exposed for improved heat dissipation.

18. The memory module of claim 17 wherein the memory module is a dual inline memory module.

19. The memory module of claim 17 further comprising: one or more stacks of memory devices coupled to a second surface of the main substrate.

20. The memory module of claim 17 wherein the coefficient of expansion of the main substrate is greater than the coefficient of expansion of the chip-scale package substrate, the coefficient of expansion of the chip-scale package substrate is greater than the coefficient of expansion of the memory semiconductor die.

21. The memory module of claim 17 wherein the coefficient of expansion of the chip-scale package substrate is selected such that the differential between a first interface thermal stress from the main substrate to a chip-scale package and a second interface thermal stress from the chip-scale package to the memory die is minimized so that the structural integrity of electrical joints at the first and second interfaces are retained.

* * * * *